(12) United States Patent
Koizumi et al.

(10) Patent No.: US 8,158,937 B2
(45) Date of Patent: Apr. 17, 2012

(54) PARTICLE BEAM SYSTEM

(75) Inventors: Mitsuru Koizumi, Tokyo (JP);
Hidetoshi Nishiyama, Tokyo (JP)

(73) Assignee: JOEL Ltd., Tokyo (JP)

( * ) Notice: Subject to any disclaimer, the term of this patent is extended or adjusted under 35 U.S.C. 154(b) by 323 days.

(21) Appl. No.: 12/546,069

(22) Filed: Aug. 24, 2009

(65) Prior Publication Data
US 2010/0051803 A1 Mar. 4, 2010

(30) Foreign Application Priority Data

Aug. 29, 2008 (JP) .................................. 2008-221698

(51) Int. Cl.
*G01N 23/00* (2006.01)
(52) U.S. Cl. ......................... 250/306; 250/310; 250/311
(58) Field of Classification Search ................... 250/306
See application file for complete search history.

(56) References Cited

U.S. PATENT DOCUMENTS 6,429,441 B1 * 8/2002 Nakasuji .................... 250/492.2
6,815,688 B2 * 11/2004 Schneiker et al. ......... 250/396 R

FOREIGN PATENT DOCUMENTS

JP A-2007-292702 11/2007

* cited by examiner

*Primary Examiner* — Phillip A Johnston
(74) *Attorney, Agent, or Firm* — The Webb Law Firm

(57) ABSTRACT

A particle beam system is offered which can prevent contamination of the inside of the objective lens, the objective lens being located at the front end of the optical column. The particle beam system has an optical column equipped with a particle beam source for emitting a particle beam and a beam passage pipe through which the beam passes. The system further includes a vacuum chamber connected with the front end portion of the column. The beam passed through the pipe is released from the front end of the column. An inner pipe is detachably disposed inside the beam passage pipe located at the front-end side of the column.

23 Claims, 3 Drawing Sheets

PARTICLE BEAM SYSTEM

BACKGROUND OF THE INVENTION

1. Field of the Invention

The present invention relates to a particle beam system using a particle beam, such as an electron beam and, more particularly, to techniques for preventing the spread of contamination to the inside of an optical column mounted inside the particle beam system.

2. Description of Related Art

A specimen inspection instrument (particle beam system) has been developed which irradiates a specimen containing a liquid held on a film with a primary beam (particle beam), such as an electron beam, via the film and detects a secondary signal, such as backscattered, electrons, emanating from the specimen in response to the irradiation.

Some particle beam systems have capabilities of a scanning electron microscope (SEM) which irradiates a specimen with an electron beam scanning the specimen, the specimen being held on the upper surface of a film exposed to the atmosphere. The beam is emitted from an optical column (i.e., primary beam irradiation source) located below the film.

In this case, the electron beam reaches the specimen via the film. The upper side of the film on which the specimen is held is in an atmospheric-pressure ambient. The opposite surface (i.e., the lower surface of the film hit by the electron beam) is exposed to a vacuum ambient.

Therefore, a pressure difference is produced between the ambient on the upper side of the film on which the specimen is held and the ambient in contact with the lower surface of the film during inspection or observation of the specimen. An unwanted external force is applied to the film due to the pressure difference. In some cases, the film is damaged by the external force. If the film is damaged, the liquid in the specimen enters the optical column via the damaged portion of the film, the column being located in the vacuum ambient. As a result, the inside of the optical column will be contaminated with the liquid.

In a conventional technique, the aforementioned contamination of the inside of the optical column is prevented by mounting a partitioning valve (open-close valve) for partitioning off the space between the film and the optical column within the vacuum chamber interposed between the film and the optical column (see JP-A-2007-292702).

In the structure disclosed in JP-A-2007-292702, the optical column constituting the primary beam irradiation source emits an electron beam upward. That is, the column is of the inverted type. Damage to the film is detected by detecting a deterioration of the vacuum inside the vacuum chamber by a vacuum gauge. If the damage to the film is detected, the partitioning valve is immediately closed.

In practice, however, at the instant when the damage to the film is detected, intrusion of the liquid into the vacuum chamber and optical column has already produced adverse effects. It is difficult to avoid the effects using the above-described structure.

If the partitioning valve is moved mechanically at high speed (i.e., opened or closed quickly), the liquid pushed out by the pressure difference between the vacuum and the atmospheric pressure moves at a very high speed. Satisfactory results cannot be obtained unless the partitioning valve is actuated in a time on the order of nanoseconds, which cannot be easily achieved in practice using a mechanical structure.

The partitioning valve is usefully closed when the ambient on the lower side of a film equipped on a specimen holder is evacuated after a specimen holder consisting of a laboratory dish has been placed on the system.

That is, when (a) the film or a film support member located close to the film has deteriorated in pressure-withstanding performance, (b) when the bonded part between the material of the laboratory dish and the film support member has deteriorated in pressure-withstanding performance, or (c) when the tip of a manipulator has damaged the film while the specimen is being manipulated by the manipulator prior to SEM observation, the partitioning valve functions to protect the column.

In the specimen inspection system having the SEM consisting of the aforementioned inverted electron optical microscope, sufficient and effective countermeasures have not been taken at present against the spread of contamination of the inside of the optical column when the film holding the specimen is damaged.

There are three countermeasures against the problem. Countermeasure (1) is to reduce the frequency or probability at which the film is damaged. Countermeasure (2) is to reduce the effects of contamination of the optical column. Countermeasure (3) consists of instantly detecting generation of a damage to the film and quickly implementing a corresponding countermeasure against the contamination.

The countermeasure (1) consists of increasing the strength of the film, for example, by improving the quality of the film or giving a warning or caution if ultraviolet radiation is emitted to thereby increase the possibility of damage to the film or if electron beam irradiation is performed for a long time during SEM observation.

The countermeasure (2) consists of operating a partitioning valve mounted between the front end of an SEM column and a film during an interval starting with the beginning of vacuum pumping of the ambient on the lower side of the film and ending immediately before an SEM observation, thus reducing contamination of the inside of the column.

The countermeasure (3) consists of instantly detecting generation of a damage to the film and operating the shutter mounted between the front end of the SEM column and the film, thus suppressing contamination instantly.

With respect to the countermeasure (1), a high-quality film that is not easily broken has not been fabricated successfully.

With respect to the countermeasures (2) and (3), the opening and closing action of the shutter or partitioning valve is a mechanical operation. An operation completed in a time of the nanosecond order, which can cope with the velocity of motion of the liquid pushed out by the pressure difference between vacuum and atmospheric pressure, cannot be achieved whatever short the operation time is made.

SUMMARY OF THE INVENTION

It is an object of the present invention to provide a particle beam system which can prevent contamination of the inside of the objective lens that is located at the front end of the optical column and is an important component in terms of performance of the column if a film holding a specimen is damaged and which, if contamination takes place within the column, permits the contaminated parts to be removed easily.

A particle beam system, according to the present invention, has an optical column equipped with a particle beam source for producing a particle beam and a beam passage (scan) pipe through which the particle beam passes. The column has a front end from which the particle beam passed through the beam passage pipe is released. The particle beam system includes a vacuum chamber connected with the front end portion of the optical column. An inner pipe is detachably disposed in the beam passage pipe located at a side of the front end of the optical column. The particle beam released from the optical column is made to impinge on a specimen.

In the particle beam system of the present invention, the inner pipe is detachably disposed in the beam passage pipe located at a side of the front end of the optical column forming the particle beam system. Consequently, if a part of the specimen intrudes into the beam passage pipe through the front end of the optical column, the part of the specimen will stay in the inner pipe. Accordingly, it is assured to prevent intrusion of the specimen into the objective lens disposed at the front end of the optical column. Hence, contamination of the inside of the objective lens can be prevented.

Furthermore, the inner pipe is detachably disposed in the beam passage pipe. Contaminated parts included inside the optical column can be easily removed by exchanging the inner pipe.

Other features and advantages of the present invention will become apparent from the following more detailed description, taken in conjunction with the accompanying drawings, which illustrate, by way of example, the principles of the invention.

DESCRIPTION OF THE PREFERRED EMBODIMENTS

Figure 1:
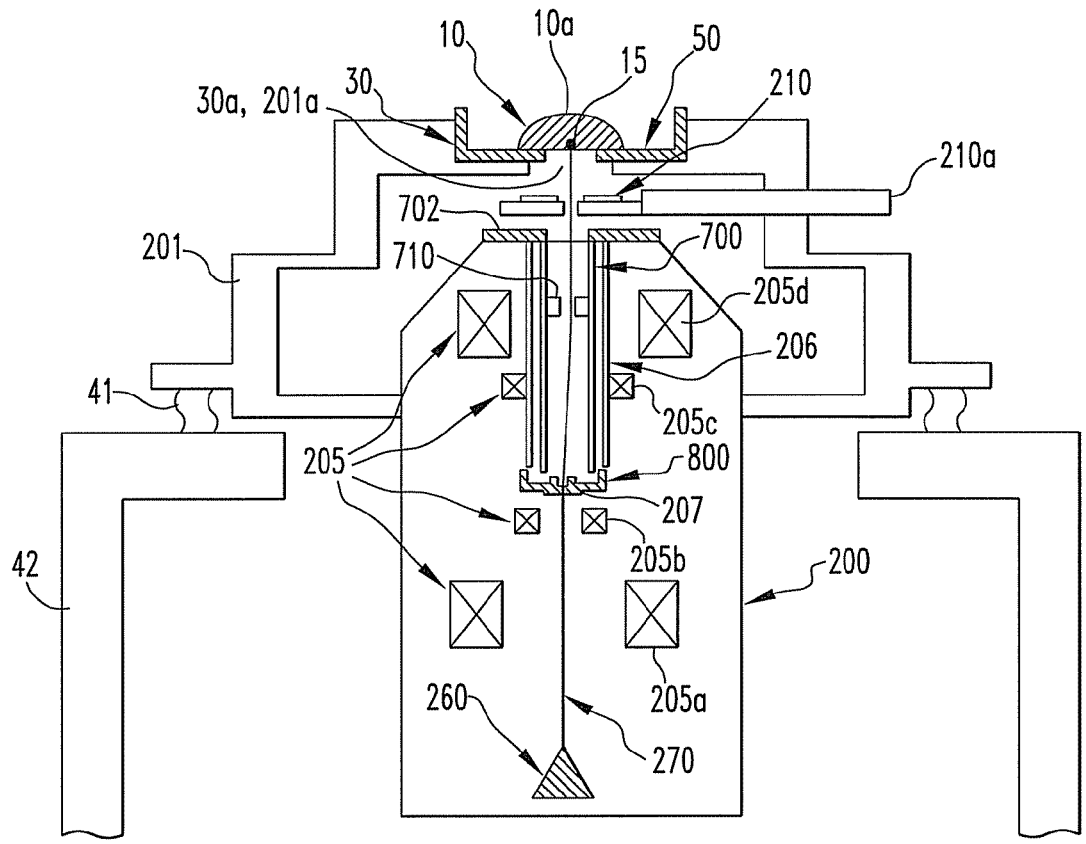
FIG. 1 is a schematic view of a particle beam system, according to the present invention.

The present invention is hereinafter described in detail with reference to the drawings. FIG. 1 is a schematic view of a particle beam system of the present invention, showing its structure. The particle beam system has the capabilities of a scanning electron microscope and has an inverted optical column.

A laboratory dish 30 for holding a specimen is placed on the particle beam system. A specimen 10 is placed on the dish 30. The specimen 10 includes a culture medium 10a that contains biological cells 15 to be observed or inspected. The upper side of the dish 30 is exposed to the atmosphere. The cells 15 can be observed from above the dish 30 with an optical microscope (not shown) located above the dish 30.

A thin film 50 is formed on the inner bottom surface of the laboratory dish 30 that holds the specimen 10. An opening 30a is formed in the dish 30 and covered with the thin film 50 that can transmit an electron beam that is one kind of charged-particle beam. The film 50 has a sufficient thickness to withstand the pressure difference of 1 atmosphere.

In particular, the material of the thin film 50 includes at least one of polymer, polyethylene, polyimide, polypropylene, carbon, silicon oxide, silicon nitride, and boron nitride. The film 50 has a thickness of 10 to 1,000 nm.

The laboratory dish 30 is placed on top of a vacuum chamber 201 constituting the particle beam system. An opening 201a is formed at the top of the vacuum chamber 201. When the dish 30 is placed on top of the vacuum chamber 201, the opening 30a covered with the thin film 50 of the dish 30 is aligned with the opening 201a in the vacuum chamber 201. In the dish 30, the specimen 10 including the culture medium 10a and cells 15 is positioned on the thin film 50. The specimen 10 is exposed to the atmospheric-pressure ambient within the dish 30.

An inverted optical column 200 is mounted in a lower position in the vacuum chamber 201. An electron beam source (particle beam source) 260 is positioned at the base end of the optical column 200. An electron beam 270 emitted upward from the electron beam source 260 is focused by a condenser lens 205a and enters a deflection coil 205b.

The electron beam 270 enters and passes through the deflection coil 205b and then undergoes a deflecting action from the coil 205b. As a result, the orbit of the beam is varied. The beam 270 then passes through an objective aperture 207 and through a receiver dish 800 and enters the base end of a scan pipe (beam passage pipe) 206. An aperture having given dimensions is formed in the objective aperture 207. The beam 270 passes through the opening. The receiver dish 800 is held in a position close to the opening in the objective aperture 207.

The scan pipe 206 assumes the form of a hollow cylinder. A hollow inner pipe 700 made of a tubular member is disposed in the pipe 206. The beam 270 passed through the objective aperture 207 and receiver dish 800 passes through the inner pipe 700. An orifice member 710 is disposed in the inner pipe 700.

After entering the scan pipe 206 and the base end of the inner pipe 700 in this way, the electron beam 270 is deflected by a second deflection coil 205c disposed on the outer side of the scan pipe 206. As a result, the orbit of the beam 270 is varied within the inner pipe 700.

The electron beam 270 which has been varied in orbit in this way passes through the orifice member 710 within the inner pipe 700 and is released from the front end of the pipe 700. A brim portion (stopper) 702 is formed at the front end of the inner pipe and in abutment with the front end of the optical column 200. Consequently, the body portion of the inner pipe 700 is disposed in the scan pipe 206 and, at the same time, is detachably mounted to the optical column 200.

An objective lens 205d is disposed on a side of the front end of the optical column 200. The electron beam 270 passed through the inner pipe 700 is released into the vacuum chamber 201 from the front end of the optical column 200 while being focused by the objective lens 205d.

A backscattered electron detector 210 is disposed in the vacuum chamber 201 and provided with an opening through which the electron beam 270 released from the optical column 200 passes. The detector 210 is supported within the vacuum chamber 201 by a support member 210a. The support member 210a is also provided with an opening through which the beam 270 can pass.

The inside of the optical column 200 and the inside of the vacuum chamber 201 are evacuated separately to create vacuum ambients or reduced-pressure ambients having respective given degrees of vacuum. The vacuum chamber 201 is placed over a pedestal 42 via a vibration-proofing device 41. The front end of the optical column 200 is held to the bottom of the vacuum chamber 201.

As described previously, the electron beam 270 released from the front end of the optical column 200 passes through the openings in the backscattered electron detector 210 and support member 210a within the vacuum chamber 201. The beam 270 passes through the opening 201a formed at the top of the vacuum chamber 201 and through the opening 30a formed at the bottom of the laboratory dish 30 and reaches the thin film 50 formed in the dish 30.

The electron beam 270 passes through the thin film 50 and hits the specimen 10 placed on the film 50. At this time, the beam 270 is deflected by the deflecting action of the deflection coil 205c and scans the specimen 10. The specimen 10 contains the cells 15 to be observed or inspected. In response to the scanning by the beam 270, backscattered electrons to be detected are produced from the cells 15 contained in the specimen 10.

The backscattered electrons emanating from the specimen 10 pass through the thin film 50 and reach the backscattered electron detector 210 positioned in the vacuum chamber 201. The backscattered electrons are detected by the detector 210, and the resulting detection signal is sent to an image data formation system (not shown). Based on the detection signal, the image data formation system creates image data about a scanned image of the specimen. Based on the image data, an image is displayed on an image display (not shown). Thus, the operator of the system can observe and inspect the cells 15.

By mounting a separate detector, it is possible to detect secondary signals, cathodoluminescent light, fluorescent light, or X-rays as a signal detected from the specimen 10 in response to the scanning by the electron beam 270.

Where a scanned image of the specimen 10 is derived by scanning the specimen 10 with the electron beam 270 via the thin film 50 and detecting a signal, such as backscattered electrons emanating from the specimen 10 in response to the scanning as described above, the lower surface of the thin film 50 that is in contact with the ambient inside the vacuum chamber 201 is exposed to a vacuum ambient, while the upper surface of the thin film 50 on which the specimen 10 is placed is exposed to the atmospheric-pressure ambient.

An external force (pressure) is applied across the thin film 50 holding the specimen 10 by the difference in pressure between the ambients, respectively, in contact with the upper and lower surfaces of the film 50. Especially, the thin film 50 has been thinned to an extent to which the electron beam 270 and backscattered electrons can pass through the film 50. The film 50 needs to withstand the pressure difference.

However, the pressure resistance of the film 50 may deteriorate with time due to the irradiation by the electron beam 270. In this case, it is highly likely that the thin film 50 is broken and damaged by the pressure difference.

If the thin film 50 is damaged as described above or other trouble occurs, the liquid specimen 10 including the culture medium 10a and cells 15 disposed on the atmospheric pressure side is made to intrude into the vacuum chamber 201 and into the optical column 200 through the damaged portion of the film 50 due to the pressure difference.

The ambient inside the optical column 200 is lower in pressure than the ambient inside the vacuum chamber 201. Therefore, a part of the specimen 10 entered in the vacuum chamber 201 further intrudes into the optical column 200.

In this case, the intrusion of the specimen 10 results in contamination of the inside of the optical column 200. This, in turn, gives rise to contact and concomitant charging. As a result, the electron beam 270 is deflected undesirably or defocusing occurs.

That is, when a contamination has taken place, the image quality or resolution may be deteriorated by deterioration of the functions of the objective aperture 207. When charging occurs, the position of the electron beam 270 on the specimen deviates irregularly, producing noise in the final image.

Accordingly, if components heavily affected by the contamination caused by intrusion of the specimen 10 can be quickly exchanged after the generation of the contamination, the system can be better maintained and serviced. Especially important components are the receiver dish 800 and the inner pipe 700 mounted close to the objective aperture 207.

In the system of the present invention, the inner pipe 700 is designed to be capable of being withdrawn from the front end of the optical column 200 and has functions similar to the functions of the scan pipe of an ordinary SEM. The inner pipe 700 is characterized in that it can be replaced after generation of contamination. A scan pipe used in a normal SEM does not assume such replacement.

In the present system, the scan pipe 206 is disposed inside the optical column 200 and extends through the objective lens 205. The hollow inside of the pipe is evacuated. The objective lens has a coil 205d located on the outer surface of the scan pipe 206. The outer surface of the scan pipe 206 is exposed to the atmosphere, taking account of heat dissipation from the coil. The coil has a contact surface in contact with an O-ring permitting the exposure to the atmosphere.

The inner pipe 700 is made of a conductive non-magnetic material. The electron beam 270 passes through the hollow inside of the pipe 700. The pipe 700 is detachable to permit replacement in order to prevent the spread of contamination into the optical column 200 due to the contamination already described.

The inner pipe 700 needs to have electrical conductivity to prevent charging. Furthermore, the pipe 700 needs to be made of a nonmagnetic material such that the magnetic field produced by a magnetic lens, such as the objective lens 205, is not disturbed by the pipe 700 and that the scanning of the electron beam 270 using the deflection coil 205c is not affected. Moreover, the orifice member 710 is disposed inside the inner pipe 700 to suppress further contamination into the optical column 200.

The receiver dish 800 mounted over the objective aperture 207 is next to the inner pipe 700 in terms of ability to prevent further contamination into the optical column 200. The receiver dish 800 functions as a water receptor that accepts the specimen 10 after the specimen passes through the inner pipe 700 without being totally blocked by the orifice member 710 and then falls. Because of the presence of the receiver dish 800, the spread of contamination of the space extending from the objective aperture 207 to the underlying electron beam source 260 within the optical column 200 can be prevented.

The optical axis of the electron beam 270 passed through the inner pipe 700 may be deviated from the optical axis of the electron beam 270 that is emitted from the electron beam source 260 toward the deflection coil 205b. That is, the axis of the objective aperture 207 is shifted from the center axis of the optical column 200 by a distance of more than 100 μm. Consequently, the specimen 10 dropping from the inner pipe 700 is caught by the receiver dish 800 with certainty. Hence, it is unlikely that the specimen 10 directly intrudes into even the electron beam source 260.

At this time, the axis of the orbit of the electron beam 270 released from the electron beam source 260 deviates from the center axis of the optical column 200 by more than 100 μm. The orbit of the beam 270 within the inner pipe 700 is corrected by the deflecting action of the deflection coils 205b and 205c such that the optical axis of the beam 270 is coincident with the center axis of the optical column 200.

The amount of deviation of the optical axis of the electron beam 270 is set to more than 100 μm to give sufficient allowance to the diameter of the objective aperture 207 in designing the system. Otherwise, the margin of safety ratio would become insufficient and sufficient effects would not be obtained.

The receiver dish 800 mounted close to the objective aperture 207 is described in further detail. The dish 800 is disposed over or beside the objective aperture 207 and held to the aperture 207. As a consequence, the receiver dish 800 and objective aperture 207 move as a unit. After the specimen 10 has entered the inner pipe 700, the objective aperture 207 is taken out of the optical column 200 together with the receiver dish 800. Then, the aperture 207 and dish 800 are cleaned or replaced.

Figure 6:
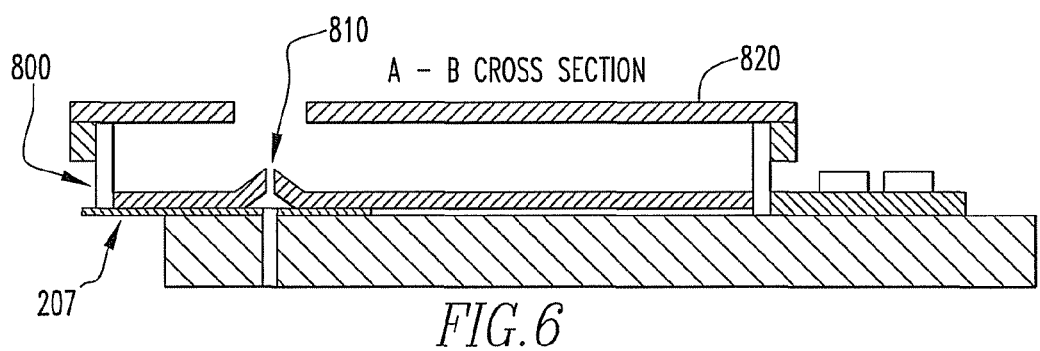
FIG. 6 is a cross-sectional view taken on line A-B of FIG. 5.

If a detachable cover 820 is disposed over the receiver dish 800 as shown in FIG. 6, splashing of the liquid from the receiver dish 800 can be prevented and, thus, the spread of contamination can be prevented. The cover 820 can be cleaned or replaced.

Figure 2:
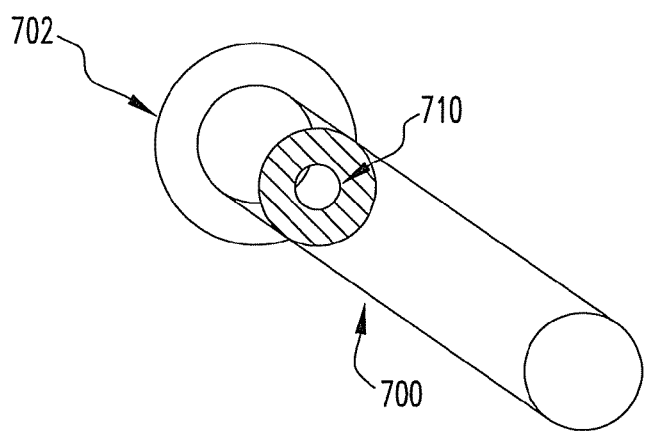
FIG. 2 is a schematic perspective view of an inner pipe.

FIG. 2 is a perspective view of the inner pipe 700, showing its shape. The brim portion 702 disposed at the front end of the body portion of the inner pipe 700 is shown at the left deepest position in the plane of the paper. The orifice member 710 is mounted in the central position of the hollow structure of the body portion. The body portion is cylindrical in shape.

The inner pipe 700 is made of a material such as phosphor bronze or aluminum, which does not affect the magnetic field and which is relatively easy to machine. Furthermore, the inner pipe can be made of a sheet of paper or resin whose surface is coated with aluminum to prevent charging.

Figure 3A:
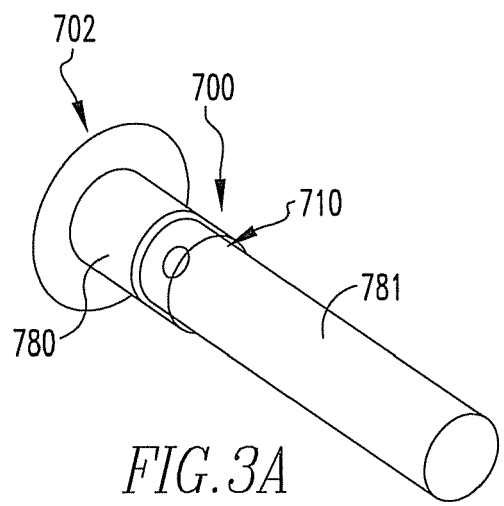
FIGS. 3A, 3B, and 3C show schematic perspective views of other inner pipes.

The inner pipe 700 can be separated into parts. For example, as shown in FIG. 3A, the inner pipe 700 can be separated into a front portion 780 and a base-end portion 781. The front portion 780 extends from the brim portion 702 to the orifice member 710. The base-end portion 781 extends from the orifice member 710 to the base end. Because of the separable structure, the front portion and the base-end portion can be made of different materials.

The base-end portion 781 can assume various forms. The base-end portion 781 shown in FIG. 3A is cylindrical and, thus, similar in shape to the scan pipe 206. However, if the base-end portion 781 is cylindrical in this way, the pipe has a very small inside diameter. After contamination, the inside is very difficult to clean. Furthermore, it is difficult to machine the base-end portion in this way and so the base-end portion 781 is expensive to fabricate.

Figure 3B:
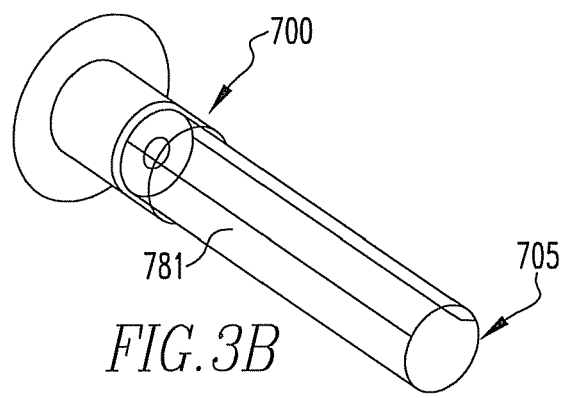
Figure 3C:
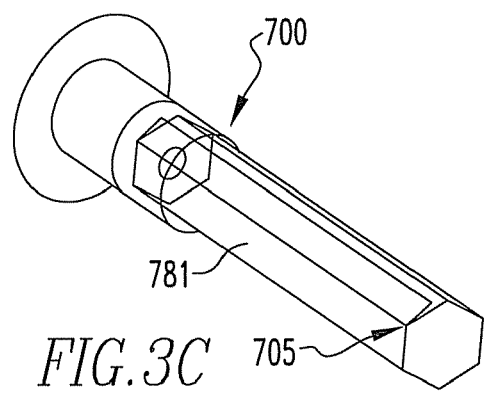

Another example of the base-end portion 781 is now described. The base-end portion 781 is fabricated like a cylinder of circular or polygonal cross section by rolling one sheet of a light material (such as aluminum alloy or paper coated with aluminum) into a cylinder as shown in FIG. 3B or 3C, by rolling and bending the sheet, or by combining these operations. With these structures, contamination can be confined, and the intrinsic performance of the present system can be achieved. In this case, it is appropriate that the folded surface of a folded portion 705 be more than 0.5 mm in width. The shape of the base-end portion 781 is appropriately adjusted using a jig or the like.

In the above examples, the material of the inner pipe 700 is a nonmagnetic material having electrical conductivity. When the inner pipe 700 of the above-described structure is mounted to the optical column 200, the orbit of the electron beam 270 acting as a primary beam is not affected unless the beam 270 is scanned over the specimen for achieving a low magnification less than a given value.

We made an experiment in which water-soluble ink was made to leak to the vacuum ambient from a very small window region formed in the thin film 50. Droplets of the ink made a flight along a substantially straight path from the leaking portion and adhered to the wall surface within the vacuum. It has been found that if there is a plate between the leaking portion and the inner wall surface, almost no ink adhered to the shade of the plate. Therefore, a blocking plate or other similar member may be mounted ahead of those portions which should be prevented against contamination.

Figure 4:
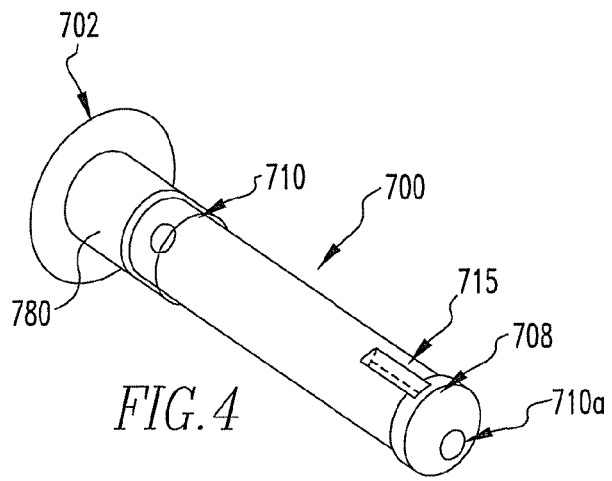
FIG. 4 is a schematic perspective view of a further inner pipe.

FIG. 4 shows an example in which a cover 708 having a hole 710a accommodating eccentricity is disposed on the base-end side of the inner pipe 700. As described previously, the spread of contamination can be prevented only with the objective aperture 207. When the optical axis of the electron beam 270 is made eccentric as mentioned previously, contamination of the specimen from the inner pipe 700 can be prevented with greater certainty by mounting the cover 708 on the base-end side. A water receiver dish portion may be formed in the cover 708.

A concave portion 715 can be formed in the base-end portion of the inner pipe 700 and in the cover 708. A convex portion engaging the concave portion 715 is formed on the inner wall of the scan pipe 206. Consequently, when the inner pipe 700 is exchanged, the positional reproducibility of the pipe 206 inside the scan pipe 206 can be improved.

The orbit of the electron beam 270 that is a primary beam can be kept unaffected by placing the concave portion 715 at a position located opposite to the position where the hole 710a through which the electron beam 270 passes is located.

The hole 710a formed in the cover 708 is made sufficiently larger than the diameter of the opening in the objective aperture 207. Consequently, the objective aperture 207 is made movable. The axis of the aperture 207 can be so adjusted that the SEM resolution is made more appropriate.

Figure 5:
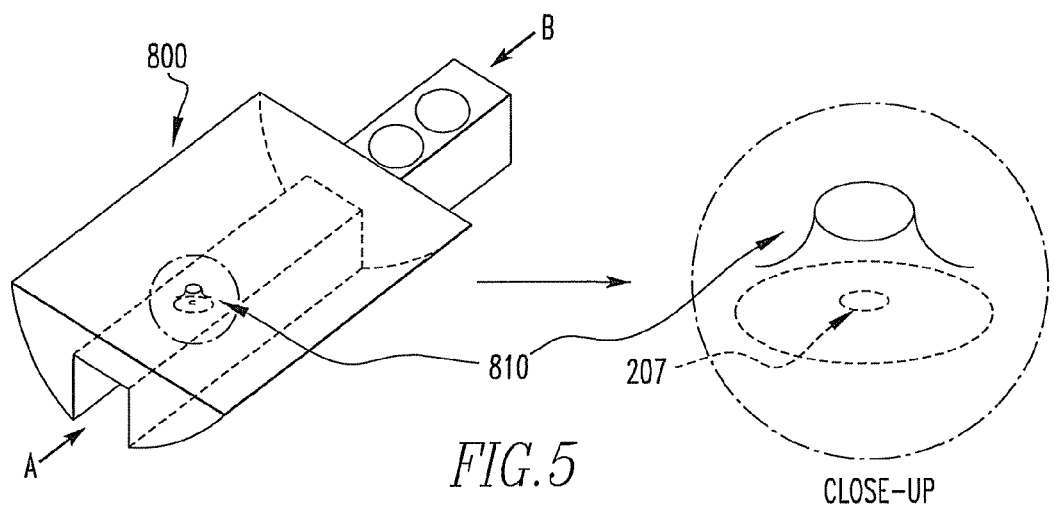
FIG. 5 is a perspective view of a receiver dish.

FIG. 5 shows an example in which the objective aperture 207 and receiver dish 800 are coupled together to form a unitary subassembly. The receiver dish 800 is disposed over the objective aperture 207 and provided with a hole 810 located over the opening in the objective aperture 207. The hole 810 can prevent liquid from flowing into the objective aperture 207. The electron beam 270 passes through the opening in the aperture 207 and through the hole 810.

The receiver dish 800 needs to have a volume corresponding to the amount of liquid ejected into the vacuum. It is considered that almost all of the moisture contained in the specimen 10 evaporates if the degree of vacuum achieved by vacuum pumping is lower than the vapor pressure. Many modern rotary pumps used for SEM applications have large pumping capabilities and some can achieve ultimate vacuums of about 1 Pa. Where such a rotary pump is used, if the receiver dish 800 is replaced after a lapse of a considerable time since generation of contamination, almost all the moisture in the receiver dish 800 will evaporate and the substances dissolved in the specimen will deposit out. It is desired to use the receiver dish of the above-described structure assuming cases where it takes long for the moisture to evaporate.

Because of the configuration described so far, contaminants consisting of parts of the specimen 10 entering from the front-end side of the optical column 200 where the objective lens 205d is located can be confined to within the inner pipe 700 and within the receiver dish 800 at the position of the objective aperture 207. Consequently, further spread of the contaminants inside the optical column 200 can be prevented.

The operator can pull the inner pipe 700 out of the front-end side of the optical column 200. Furthermore, the receiver dish 800 can be pulled out together with the movable objective aperture 207. Consequently, after generation of contamination, the inner pipe 700 and receiver dish 800 can be easily replaced. The spread of the contaminants can be prevented more effectively because the orifice member 710 is disposed in the inner pipe 700.

The inner pipe 700 can be fabricated at low cost if the pipe 700 is made of aluminum foil and bending or rounding it into the final shape of the pipe 700. Where the inner pipe 700 is made of aluminum foil, a member becoming a core of a cylinder of circular or polygonal cross section can be used as a jig. The inner pipe can be fabricated very efficiently by winding the aluminum foil around the jig (core) and holding the outside of the jig with tape. Because the outer tape is not irradiated with the electron beam 270, no charging takes place. Consequently, commercially available cellophane tape and vinyl tape can be used.

The inner pipe 700 does not need to be a seamless pipe of stainless steel. Where the inner pipe 700 is made of plural members, if the width of the portions of the members which have been folded and brought together is more than 0.5 mm, requisite functions are implemented sufficiently.

In the system having the inverted optical column 200 as in the present embodiment, it is necessary to protect the system against contamination caused by intrusion of the specimen 10 including culture medium and biological cells into the system when the thin film 50 is broken. It is essential that those components which readily affect the performance of the system if contaminated be replaced quickly. Use of the inner pipe 700 makes it possible to certainly prevent contamination of the region extending from the front end of the objective lens 205d to the objective aperture 207 within the optical column 200.

In this way, the particle beam system of the present invention has the particle beam source 260 and the beam passage (scan) pipe 206 permitting passage of the particle beam 270 from the particle beam source 260. The system further includes the optical column 200 and the vacuum chamber 201 connected with the front end of the column 200. The particle beam 270 passed through the pipe 206 is released from the front end of the optical column 200. The particle beam 270 released from the column 200 is made to impinge on the specimen 10. The inner pipe 700 is detachably disposed in the beam passage pipe 206 located at the front-end side of the optical column 200.

The orifice member 710 is mounted inside the inner pipe 700. The orifice member 710 may also be mounted at least at one end of the inner pipe 700. The orifice member 710 can be made separable from the body portion of the inner pipe 700.

The inner pipe 700 can be made of a nonmagnetic conductive material. For example, the inner pipe 700 can be made of copper, phosphor bronze, or aluminum alloy.

Furthermore, the inner pipe 700 can be made of a conductive sheet fabricated by coating the surface of paper or resinous sheet with aluminum. Alternatively, the inner pipe 700 may be made of a sheet of an aluminum alloy. One specific example of the inner pipe 700 is fabricated by rounding one or more sheets identical in structure with the aforementioned conductive sheet or aluminum alloy sheet into a pillar form of polygonal or circular cross section. The width of the portions of the members which have been folded and brought together can be set to greater than 0.5 mm.

In the optical column 200, the aperture member 207 having the opening is aligned with the base-end side of the inner pipe 700. The receiver dish 800 is held to the aperture member 207. The aperture member 207 can move together with the receiver dish 800.

The center axis of the opening in the aperture member 207 deviates from the axis of the optical column 200 by more than 0.1 mm. The base end of the optical column 200 where the particle beam source 260 is located is under the front end of the optical column 200 where the front end of the beam passage (scan) pipe 206 is located.

The particle beam 270 released from the optical column 200 is made to impinge on the specimen 10 through the film 50 that transmits the particle beam 270. The system can have a detector for detecting backscattered electrons, secondary electrons, cathodoluminescent light, fluorescent light, or X-rays produced from the specimen 10 in response to the impingement.

In the system of the present invention, the inner pipe 700 is detachably disposed in the beam passage pipe 206 located at the front end of the optical column 200 constituting the particle beam system. Consequently, if any part of the specimen 10 intrudes into the beam passage pipe 206 through the front end of the optical column 200, the specimen part will stay in the inner pipe 700. Therefore, it is possible to certainly prevent the situation where the specimen 10 intrudes into the objective lens 205d disposed at the front end of the optical column 200, thus contaminating the inside.

In addition, the inner pipe 700 is detachably disposed inside the beam passage pipe 206 and so contaminated parts inside the optical column 200 can be easily removed by exchanging the inner pipe 700.

In this manner, the particle beam system of the present invention has the particle beam source 260 and the beam passage pipe 206 permitting passage of the particle beam 270 emitted from the particle beam source 260. The system further includes the optical column 200 and the vacuum chamber 201 connected with the front end of the column 200. The particle beam 270 passed through the pipe 206 is released from the front end of the column 200. The particle beam 270 released from the optical column 200 is made to impinge on the specimen 10. The particle beam system is characterized in that the inner pipe 700 is detachably disposed inside the beam passage pipe 206 located at a side of the front end of the column 200.

In another feature of the present invention, the inner pipe 700 is disposed so as to be detachable from the front end of the optical column 200. The inner pipe 700 has the brim portion 702 located outside the front end of the optical column 200. The orifice member 710 is mounted inside the inner pipe 700 or at least at one end of the inner pipe 700. The orifice member 710 can be made separable from the body portion of the inner pipe 700.

The inner pipe 700 can be made of a nonmagnetic conductive material. More specifically, the inner pipe 700 can be made of copper, phosphor bronze, or aluminum alloy. Furthermore, the inner pipe 700 can be made of a conductive sheet or aluminum alloy sheet. The conductive sheet is fabricated by coating the surface of a sheet of paper or resin with aluminum. One specific example of the inner pipe 700 is fabricated by rounding one or more sheets identical in structure with the aforementioned conductive sheet or aluminum alloy sheet into a pillar form of polygonal or circular cross section. The width of the portions of the members which have been folded and brought together can be set to greater than 0.5 mm.

In the optical column 200, the aperture member 207 having an opening is aligned with the base-end side of the inner pipe 700. The receiver dish 800 is held to the aperture member 207. The aperture member 207 can be made movable together with the receiver dish 800. Preferably, the center axis of the opening in the aperture member 207 deviates from the axis of the optical column 200 by more than 0.1 mm.

If the inner wall surface of the inner pipe 700 is plasma treated or UV treated, liquid entered in the inner pipe 700 can be held inside it because the inner wall surface treated in this way shows hydrophilic properties.

Besides, a layer of a water-absorbing material can be formed on the inner wall surface of the inner pipe 700. The water-absorbing material can be a high polymer absorbent.

Examples of the high polymer absorbent include carboxylmethyl cellulose sodium, copolymer of acrylic acid and acrylic acid sodium, sodium polyacrylate, and polyacrylates. Other examples include cross-linked polyacrylics, cross-linked polystyrene sulfonic acid, cross-linked carboxymethyl cellulose, cross-linked maleic acid anhydrides, cross-linked cellulose ethers, cross-linked polyethylene oxides, and cross-linked polyvinyl alcohols.

The above-described water-absorbing material is not restricted to high polymer absorbents. Silica gel, potassium chlorides, magnesium chlorides, and cobalt chlorides can also be used.

Such water-absorbing materials can also hold the liquid inside the inner pipe 700 after the liquid has intruded into the inner pipe 700.

The base end of the optical column 200 where the particle beam source 260 is located is under the front end of the optical column 200 at which the front end of the beam passage (scan) pipe 206 is located. The particle beam 270 released from the column 200 impinges on the specimen 10 through the film 50 that can transmit the particle beam 270. A secondary signal produced from the specimen 10 in response to the impingement is detected by the detector 210.

At this time, a first surface of the film 50 is in contact with the vacuum ambient inside the vacuum chamber 201. A second surface of the film 50 is in contact with the atmospheric-pressure ambient opened to permit access from the outside. The particle beam 270 is directed via the film 50 at the specimen 10 held on the second surface of the film 50 from a side of the first surface of the film 50. The first surface of the film 50 is the lower surface of the film 50. The second surface of the film 50 is the upper surface of the film 50.

The material of the film 50 contains at least one of polymer, polyethylene, polyimide, polypropylene, carbon, silicon oxide, silicon nitride, and boron nitride. The thickness of the film can be set to the range from 10 to 1,000 nm.

A secondary signal produced from the specimen 10 can be any one type of backscattered electrons, secondary signals, cathodoluminescent light, fluorescent light, and X-rays.

Because of the structure of the system of the present invention, if any part of the specimen 10 intrudes into the beam passage pipe 206 through the front end of the optical column 200, the part of the specimen 10 will stay in the inner pipe 700.

Therefore, contamination of the inside of the objective lens 205d due to intrusion of the specimen 10 into the objective lens 205d located at the front end of the optical column 200 can be prevented with certainty. Furthermore, contaminated components inside the optical column 200 can be easily removed by exchanging the inner pipe 700 because the inner pipe 700 is detachably disposed in the beam passage pipe 206.

Having thus described our invention with the detail and particularity required by the Patent Laws, what is desired protected by Letters Patent is set forth in the following claims.

The invention claimed is:

1. A particle beam system comprising: an optical column equipped with a particle beam source for producing a particle beam for being directed at a specimen located on a thin film, where the specimen can intrude into said optical column and a beam passage pipe through which the particle beam passes, and having a front end from which the particle beam passed through the beam passage pipe is released; and a vacuum chamber connected with the front end portion of the optical column; wherein an inner pipe arranged in the beam passage pipe has a body portion detachably disposed in the beam passage pipe located at a side of the front end of the optical column for protecting the beam passage pipe from contamination due to intrusion of the specimen, and wherein the particle beam passed through the inner pipe and on release from the optical column is made to impinge on the specimen.

2. A particle beam system as set forth in claim 1, wherein said inner pipe is disposed in such a way that it can be inserted and detached from the front end of the optical column.

3. A particle beam system as set forth in claim 2, wherein said inner pipe has a stopper located outside the front end of said optical column.

4. A particle beam system as set forth in any one of claims 1 to 3, wherein an orifice member is mounted inside said inner pipe.

5. A particle beam system as set forth in any one of claims 1 to 3, wherein an orifice member is mounted at least at one end of said inner pipe.

6. A particle beam system as set forth in claim 4, wherein said orifice member can be separated from a body portion of said inner pipe.

7. A particle beam system as set forth in any one of claims 1 to 3, wherein said inner pipe is made of a nonmagnetic and/or electrically conductive material.

8. A particle beam system as set forth in any one of claims 1 to 3, wherein said inner pipe is made of any one of copper, phosphor bronze, and an aluminum alloy.

9. A particle beam system as set forth in any one of claims 1 to 3, wherein said inner pipe is made of a sheet of an aluminum alloy or an electrically conductive sheet fabricated by coating a surface of a sheet of paper or resin with aluminum.

10. A particle beam system as set forth in claim 9, wherein said inner pipe has been fabricated by rounding one or more of the electrically conductive sheet or the sheet of the aluminum alloy into a pillar form of polygonal or circuit cross section, and wherein portions of the sheet or sheets which have been folded and brought together have a width of more than 0.5 mm.

11. A particle beam system as set forth in any one of claims 1 to 3, wherein an aperture member having an opening is disposed in said optical column and aligned with a base end of said inner pipe, and wherein a receiver dish is held to the aperture member and movable together with the receiver dish.

12. A particle beam system as set forth in claim 11, wherein the opening in said aperture member has a center axis deviating from an axis of said optical column by more than 0.1 mm.

13. A particle beam system comprising:
an optical column equipped with a particle beam source for producing a particle beam for being directed at a specimen and a beam passage pipe through which the particle beam passes, and having a front end from which the particle beam passed through the beam passage pipe is released; and
a vacuum chamber connected with the front end portion of the optical column;
wherein an inner pipe arranged in the beam passage pipe has a body portion detachably disposed in the beam passage pipe located at a side of the front end of the optical column for protecting the beam passage pipe from contamination due to intrusion of the specimen, and wherein the particle beam passed through the inner pipe and on release from the optical column is made to impinge on the specimen,
wherein said inner pipe has an inner wall surface that has been plasma treated or UV treated.

14. A particle beam system comprising:
an optical column equipped with a particle beam source for producing a particle beam for being directed at a specimen and a beam passage pipe through which the particle beam passes, and having a front end from which the particle beam passed through the beam passage pipe is released; and a vacuum chamber connected with the front end portion of the optical column;

wherein an inner pipe arranged in the beam passage pipe has a body portion detachably disposed in the beam passage pipe located at a side of the front end of the optical column for protecting the beam passage pipe from contamination due to intrusion of the specimen, and wherein the particle beam passed through the inner pipe and on release from the optical column is made to impinge on the specimen, wherein said inner pipe member has an inner wall surface on which a layer of a water-absorbing material is formed.

15. A particle beam system as set forth in claim 14, wherein said water-absorbing material is made of a high polymer absorbent.

16. A particle beam system as set forth in claim 15, wherein said high polymer absorbent is carboxylmethyl cellulose sodium, copolymer of acrylic acid and acrylic acid sodium, a sodium polyacrylate, a polyacrylate, a cross-linked polyacrylic, a cross-linked polystyrene sulfonic acid, a cross-linked carboxymethyl cellulose, a cross-linked maleic acid anhydride, a cross-linked cellulose ether, a cross-linked polyethylene oxide, or a cross-linked polyvinyl alcohol.

17. A particle beam system as set forth in claim 14, wherein said water-absorbing material is made of any one of silica gel, potassium chloride, magnesium chloride, and cobalt chloride.

18. A particle beam system as set forth in claim 14, wherein a base end of said optical column where said particle beam source is located is under the front end of the optical column at which a front end of said beam passage pipe is located.

19. A particle beam system as set forth in claim 14, wherein said particle beam released from said optical column is made to impinge on the specimen via a film that can transmit the particle beam, and wherein there is further provided a detector for detecting a secondary signal produced from the specimen in response to the impingement.

20. A particle beam system as set forth in claim 19, wherein said film has a first surface in contact with a vacuum ambient and a second surface in contact with an atmospheric-pressure ambient opened to permit access from the outside, and wherein said particle beam is made to impinge on the specimen held on the second surface of the film via the film from a side of the first surface of the film.

21. A particle beam system as set forth in claim 20, wherein said first surface of the film is a lower surface of the film, and wherein said second surface of the film is an upper surface of the film.

22. A particle beam system as set forth in claim 19, wherein said film includes at least one of polymer, polyethylene, polyimide, polypropylene, carbon, silicon oxide, silicon nitride, and boron nitride, and wherein the film has a thickness of 10 to 1,000 nm.

23. A particle beam system as set forth in claim 19, wherein the secondary signal produced from said specimen is any one type of backscattered electrons, secondary electrons, cathodoluminescent light, fluorescent light, and X-rays.

* * * * *

UNITED STATES PATENT AND TRADEMARK OFFICE
CERTIFICATE OF CORRECTION

PATENT NO.         : 8,158,937 B2
APPLICATION NO.    : 12/546069
DATED              : April 17, 2012
INVENTOR(S)        : Mitsuru Koizumi et al.

It is certified that error appears in the above-identified patent and that said Letters Patent is hereby corrected as shown below:

On the Title Page:

Item (73) Assignee, Line 1, delete "JOEL" and insert -- JEOL --

Signed and Sealed this
Fourth Day of September, 2012

David J. Kappos
*Director of the United States Patent and Trademark Office*